United States Patent
Odajima et al.

(10) Patent No.: US 8,447,251 B2
(45) Date of Patent: May 21, 2013

(54) AUDIO SIGNAL PROCESSING CIRCUIT

(75) Inventors: Toru Odajima, Oota (JP); Masahiro Obuchi, Oizumi-machi (JP)

(73) Assignees: Sanyo Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 552 days.

(21) Appl. No.: 12/569,499

(22) Filed: Sep. 29, 2009

(65) Prior Publication Data

US 2010/0081398 A1   Apr. 1, 2010

(30) Foreign Application Priority Data

Sep. 29, 2008   (JP) .................. 2008-251473

(51) Int. Cl.
*H04B 1/28*   (2006.01)
(52) U.S. Cl.
USPC .............. 455/150.1; 455/351; 455/90.3
(58) Field of Classification Search
USPC .................... 455/150.1, 351, 90.3
See application file for complete search history.

(56) References Cited

U.S. PATENT DOCUMENTS

| | | | | |
|---|---|---|---|---|
| 4,489,442 A | * | 12/1984 | Anderson et al. | 381/81 |
| 5,134,651 A | * | 7/1992 | Ortiz et al. | 379/144.08 |
| 5,323,367 A | * | 6/1994 | Tamura et al. | 369/30.36 |
| 5,717,671 A | * | 2/1998 | Aramaki | 369/47.12 |
| 5,771,441 A | * | 6/1998 | Altstatt | 455/66.1 |
| 5,974,304 A | * | 10/1999 | Chen | 455/90.2 |
| 7,792,499 B2 | * | 9/2010 | Chen et al. | 455/90.2 |
| 2007/0126510 A1 | * | 6/2007 | Tsai | 330/297 |
| 2007/0149154 A1 | * | 6/2007 | Walker et al. | 455/184.1 |
| 2007/0254589 A1 | * | 11/2007 | Sloan et al. | 455/47 |

FOREIGN PATENT DOCUMENTS

JP   2007-088657   4/2007

* cited by examiner

*Primary Examiner* — Temesgh Ghebretinsae
*Assistant Examiner* — Richard Chan
(74) *Attorney, Agent, or Firm* — Osha Liang LLP

(57) ABSTRACT

An audio signal processing circuit comprising: a modulation circuit configured to output a modulated signal of a frequency corresponding to an input audio signal; a drive circuit configured to generate a driving current for driving the modulation circuit based on a control signal; an audio detection circuit configured to detect presence or absence of the audio signal input to the modulation circuit; and a control signal generation circuit configured to generate the control signal for generating the driving current in the drive circuit when the presence of the audio signal is detected and generate the control signal for stopping generation of the driving current in the drive circuit when the absence of the audio signal is detected for a predetermined period, based on a detection result of the audio detection circuit.

2 Claims, 6 Drawing Sheets

_US 8,447,251 B2_

AUDIO SIGNAL PROCESSING CIRCUIT

CROSS-REFERENCE TO RELATED APPLICATION

This application claims the benefit of priority to Japanese Patent Application No. 2008-251473, filed Sep. 29, 2008, of which full contents are incorporated herein by reference.

BACKGROUND OF THE INVENTION

1. Field of the Invention

The present invention relates to an audio signal processing circuit.

2. Description of the Related Art

Recently, an FM (frequency modulation) transmitter circuit is used to reproduce music data recorded in a portable music reproduction device or the like, by a car stereo, for example (See Japanese Patent Laid-Open Publication No. 2007-88657, for example.)

FIG. 6 is an example of a configuration of a transmission device 200 for transmitting an audio signal. When an audio signal from a portable music reproduction device (hereinafter referred to as "a music reproduction device") 210 is reproduced by a car stereo (not shown,) a user first operates a setting device 310 for starting an FM transmitter circuit 300. A microcomputer 320 outputs to the FM transmitter circuit 300 a control signal for starting the FM transmitter circuit 300 based on an operation result of the setting device 310. The user then take into consideration a frequency of an FM radio or the like being used in a surrounding area, and operates the setting device 310 so as to set a transmit frequency of the FM transmitter circuit 300. The microcomputer 320 outputs data corresponding to a desired transmit frequency to the FM transmitter circuit 300 based on the operation result of the setting device 310. Thereafter, when the user reproduces music stored in the music reproduction device 210, a carrier wave set in the FM transmitter circuit 300 is frequency-modulated by the audio signal, to be transmitted to the car stereo.

On the other hand, in order to stop reproduction of music performed by the car stereo, the user operates the music reproduction device 210 so as to stop output of the audio signal. Then, the user stops the FM transmitter circuit 300, that is, operates the setting device 310 so that there is no power consumption in the FM transmitter circuit 300. As a result, the microcomputer 320 outputs to the FM transmitter circuit 300 a control signal for stopping the FM transmitter circuit 300. As mentioned above, the user operates the music reproduction device 210 and the setting device 310, to be able to reproduce by the car stereo music stored in the music reproduction device 210 and stop reproduce it.

In order to start or stop the above-mentioned FM transmitter circuit 300, the microcomputer 320 needs to output a control signal for starting or stopping the FM transmitter circuit 300 based on an operation result of the setting device 310. That is, in the transmission device 200, a circuit for controlling the FM transmitter circuit 300, such as the microcomputer 320, should generate a control signal for controlling a state of the FM transmitter circuit 300.

SUMMARY OF THE INVENTION

An audio signal processing circuit according to an aspect of the present invention, comprises: a modulation circuit configured to output a modulated signal of a frequency corresponding to an input audio signal; a drive circuit configured to generate a driving current for driving the modulation circuit based on a control signal; an audio detection circuit configured to detect presence or absence of the audio signal input to the modulation circuit; and a control signal generation circuit configured to generate the control signal for generating the driving current in the drive circuit when the presence of the audio signal is detected and generate the control signal for stopping generation of the driving current in the drive circuit when the absence of the audio signal is detected for a predetermined period, based on a detection result of the audio detection circuit.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

Figure 1:
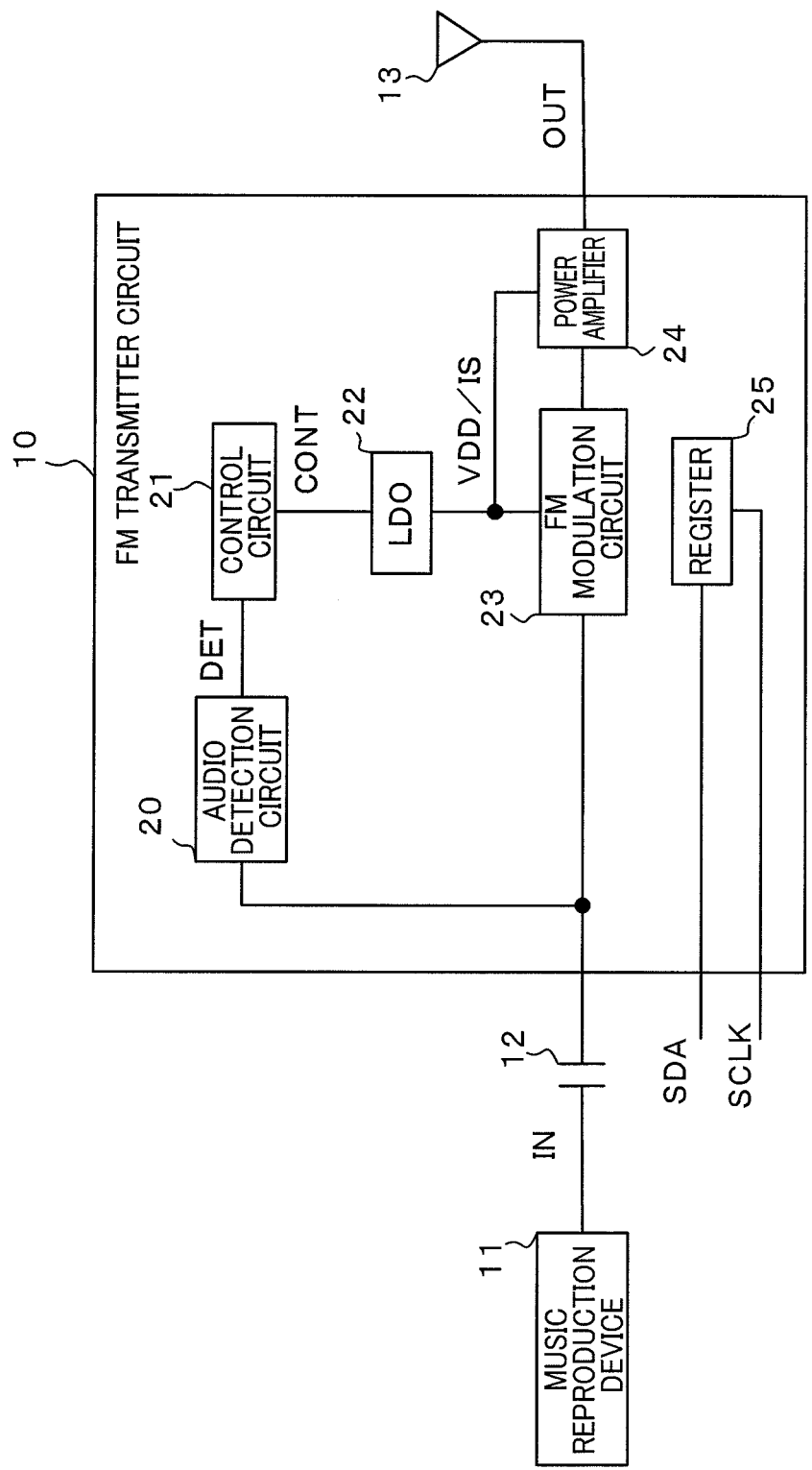
FIG. 1 is a diagram illustrating a configuration of an FM transmitter circuit 10 according to an embodiment of the present invention.

FIG. 1 is a diagram illustrating a configuration of an FM transmitter circuit 10 according to an embodiment of the present invention. The FM transmitter circuit 10 (audio signal processing circuit) is a circuit for frequency modulating a carrier wave by an audio signal IN input from a music reproduction device 11 to be transmitted by radio to a car stereo through an antenna 13.

The FM transmitter circuit 10 includes an audio detection circuit 20, a control circuit 21, an LDO (Low Dropout) regulator 22, an FM modulation circuit 23, a power amplifier 24, and a register 25. It is assumed that the FM transmitter circuit 10 according to an embodiment of the present invention is integrated.

The audio signal detection circuit 20 detects presence or absence of the audio signal IN from the music reproduction device 11. Specifically, the audio signal detection circuit 20 compares a level of the analog audio signal IN having a predetermined amplitude which is input from the music reproduction device 11 through a capacitor 12, with a threshold voltage at a predetermined level. When the level of the audio signal IN is higher than the threshold voltage, a detection signal DET of a high level (hereinafter referred to as H level) is output which indicates presence of the audio signal IN. On the other hand, when the level of the audio signal IN is lower than the threshold voltage, a detection signal DET of a low level (hereinafter referred to as L level) indicating absence of the audio signal IN is output. Thus, when the audio signal IN is not output from the music reproduction device 11, the audio signal detection circuit 20 outputs the L-level detection signal DET.

As the audio signal detection circuit 20, a peak-hold circuit may be used, which holds a peak level of the audio signal IN, compares the peak level of the audio signal IN with the predetermined threshold voltage, and outputs the detection signal DET indicating the presence of the audio signal IN when the peak level of the audio signal IN held thereby is higher than the predetermined threshold voltage, for example.

The control circuit 21 (control signal generation circuit) outputs a control signal CONT at H level in order to start the LDO regulator 22, when the detection signal DET at H level is output which indicates the presence of the audio signal IN. The control circuit 21 outputs a control signal CONT at L level in order to stop the LDO regulator 22, when the detection signal DET at L level which indicates the absence of the audio signal IN is output for a predetermined period.

The LDO regulator 22 (drive circuit) generates a power supply voltage VDD for the FM modulation circuit 23 and the power amplifier 24 based on a logic level of the control signal CONT from the control circuit 21. Specifically, when the control signal CONT becomes H level, the power supply voltage VDD is generated, and a driving current IS for driving the FM modulation circuit 23 and the power amplifier 24, which are loads, is generated. On the other hand, when the control signal CONT becomes L level, the generation of the power supply voltage VDD is stopped. Therefore, the generation of the driving current IS for the FM modulation circuit 23 and the power amplifier 24 is also stopped.

The FM modulation circuit 23 generates a carrier wave with a frequency corresponding to frequency data stored in the register 25, and frequency-modulates the carrier wave by the input audio signal IN, to be output.

The power amplifier 24 amplifies the frequency-modulated output from the FM modulation circuit 23, to be output to the antenna 13. In an embodiment of the present invention, an output signal OUT output from the power amplifier 24 is transmitted through the antenna 13, to be received by the car stereo.

The register 25 stores data SDA output from the microcomputer (not shown) in synchronization with a clock signal SCLK, for example. The data SDA according to an embodiment of the present invention is data for setting a state of the FM transmitter circuit 10 and, for example, includes frequency data for setting a frequency of the carrier wave generated in the FM modulation circuit 23 and data for designating whether or not the output of the power amplifier 24 is muted.

<First embodiment of control circuit 21 and example of operation of FM transmitter circuit 10>

Figure 2:
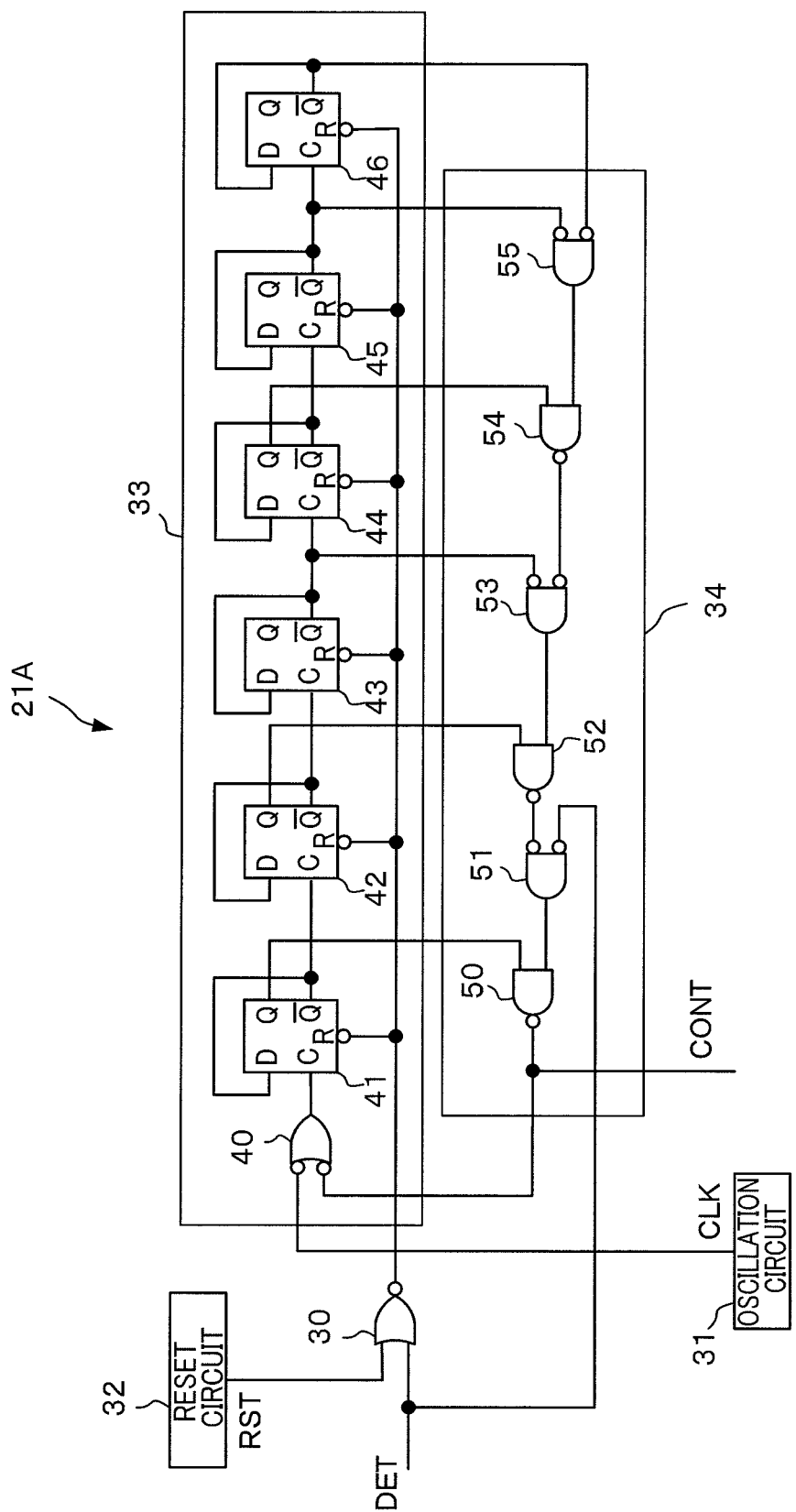
FIG. 2 is a diagram illustrating a configuration of a control circuit 21A according to a first embodiment of a control circuit 21.

A first embodiment of the control circuit 21 will be described referring to FIG. 2. The control circuit 21 shown in FIG. 2 will hereinafter be referred to as a control circuit 21A.

The control circuit 21A includes a NOR circuit 30, an oscillation circuit 31, a reset circuit 32, a counter 33, and a control signal output circuit 34.

The NOR circuit 30 performs a negative OR operation on the input detection signal DET and a reset signal RST from the reset circuit 32, to be output to a counter 33. If either one of the detection signal DET or the rest signal RST is H level, the output of the NOR circuit 30 is L level. On the other hand, if both the detection signal DET and the reset signal RST are L level, the output of the NOR circuit is H level.

The oscillation circuit 31 generates a clock signal CLK with a predetermined cycle, to be and output to the counter 33. The oscillation circuit 31 can be made up using a general crystal oscillation circuit, for example. It is assumed that the oscillation circuit 31 according to an embodiment of the present invention starts generating the clock signal CLK with a predetermined cycle when a power supply voltage is applied to the FM transmitter circuit 10.

The reset circuit 32 output the reset signal RST having an H level pulse in order to reset a count value of the counter 33, when the power supply voltage is applied to the FM transmitter circuit 10.

The counter 33 changes the count value in synchronization with the clock signal CLK, and includes an OR circuit 40 and D flip-flops 41 to 46.

The OR circuit 40 is an OR circuit having negative logic inputs and a positive logic output. The OR circuit 40 according to an embodiment of the present invention changes an output based on logic levels of the clock signal CLK and the control signal CONT from the control signal output circuit 34. For example, when the control signal CONT at H level is input to the OR circuit 40, the output of the OR circuit 40 is changed in synchronization with the clock signal CLK. On the other hand, when the control signal CONT at L level is input to the OR circuit 40, the output of the OR circuit 40 becomes H level.

The D flip-flop 41 has a D input and a reversed Q output (hereinafter referred to as QN output) connected to each other. Thus, the D-flip-flop 41 is a 1-bit counter which reverses logic levels of the Q output and the QN output of the D flip-flop 41 every time a pulse of H level is input to a C input. D flip-flops 42 to 46 have configurations similar to the configuration of the D flip-flop 41, and the QN outputs of the D flip-flops 41 to 45 are input to the C inputs of the D flip-flops 42 to 46, respectively. Therefore, the D flip-flops 41 to 46 according to an embodiment of the present invention makes up a 6-bit counter. Each of the D flip-flops 41 to 46 according to an embodiment of the present invention is reset based on a signal at L level. Thus, when the output of the NOR circuit 30 is L level, that is, when the reset signal RST is H level or the presence of the audio signal IN is detected so that the detection signal DET is H level, a count value of the 6-bit counter is reset which is made up of the D flip-flops 41 to 46. On the other hand, when the output of the NOR circuit 30 is H level, that is, when both the detection signal DET and the reset signal RST are L level, the count value of the 6-bit counter made up of the D flip-flops 41 to 46 is changed based on the output from the OR circuit 40. In the case that the output of the NOR circuit 30 is H level, when the clock signal CLK is output from the OR circuit 40, the count value of the 6-bit counter is increased, and when the output of the OR circuit 40 becomes H level based on the control signal CONT at L level as mentioned above, the count value is not changed.

The control signal output circuit 34 changes the control signal CONT based on the detection signal DET and the count value of the counter 33, and includes NAND circuits 50, 52, and 54, and AND circuits 51, 53, and 55. The AND circuits 51, 53, and 55 are AND circuits having negative logic inputs and a positive logic output. Here, a circuit made up of the NAND circuit 50 and the AND circuit 51 will be described.

If logic levels input to the AND circuit 51 is any one of (H, H), (H, L), and (L, H), the output of the AND circuit 51 is L level. On the other hand, the logic levels input to the AND circuit 51 is (L, L), the output of the AND circuit 51 is H level. If the logic levels input to the NAND circuit 50 is any one of (L, L), (H, L), and (L, H), the control signal CONT, which is the output of the NAND circuit 50, is H level. On the other hand, if the logic levels input to the NAND circuit 50 is (H, H), the control signal CONT, which is the output of the NAND circuit 50, is L level. Therefore, in the circuit made up of the NAND circuit 50 and the AND circuit 51, only if the logic levels input to the AND circuit 51 is (L, L) and the logic level of one input of the NAND circuit 50, which is not connected to the output from the AND circuit 51, is H level, the NAND circuit 50 outputs the control signal CONT at L level which does not changes the count value of the counter 33. In an embodiment of the present invention, the NAND circuit 52 and the AND circuit 53 as well as the NAND circuit 54 and the AND circuit 55 have configurations similar to the configuration of the NAND circuit 50 and the AND circuit 51, they operate similarly to the NAND circuit 50 and the AND circuit 51. Moreover, in an embodiment of the present invention, the Q outputs of the D flip-flops 41, 42, and 44 are input to the NAND circuits 50, 52, and 54, respectively. Furthermore, the QN output of the D flip-flop 43 is input to the AND circuit 53, and the QN output of the D flip-flops 45 and 46 is input to the AND circuit 55.

Therefore, the control signal output circuit 34 according to an embodiment of the present invention outputs the control signal CONT at L level only if all of the Q outputs of the D flip-flops 41 to 46 are H level, that is, the count value of the 6-bit counter 33 is 63 (decimal number) and the detection signal DET is L level, and the control signal output circuit 34 outputs the control signal CONT at H level in cases other than the above.

Figure 3:
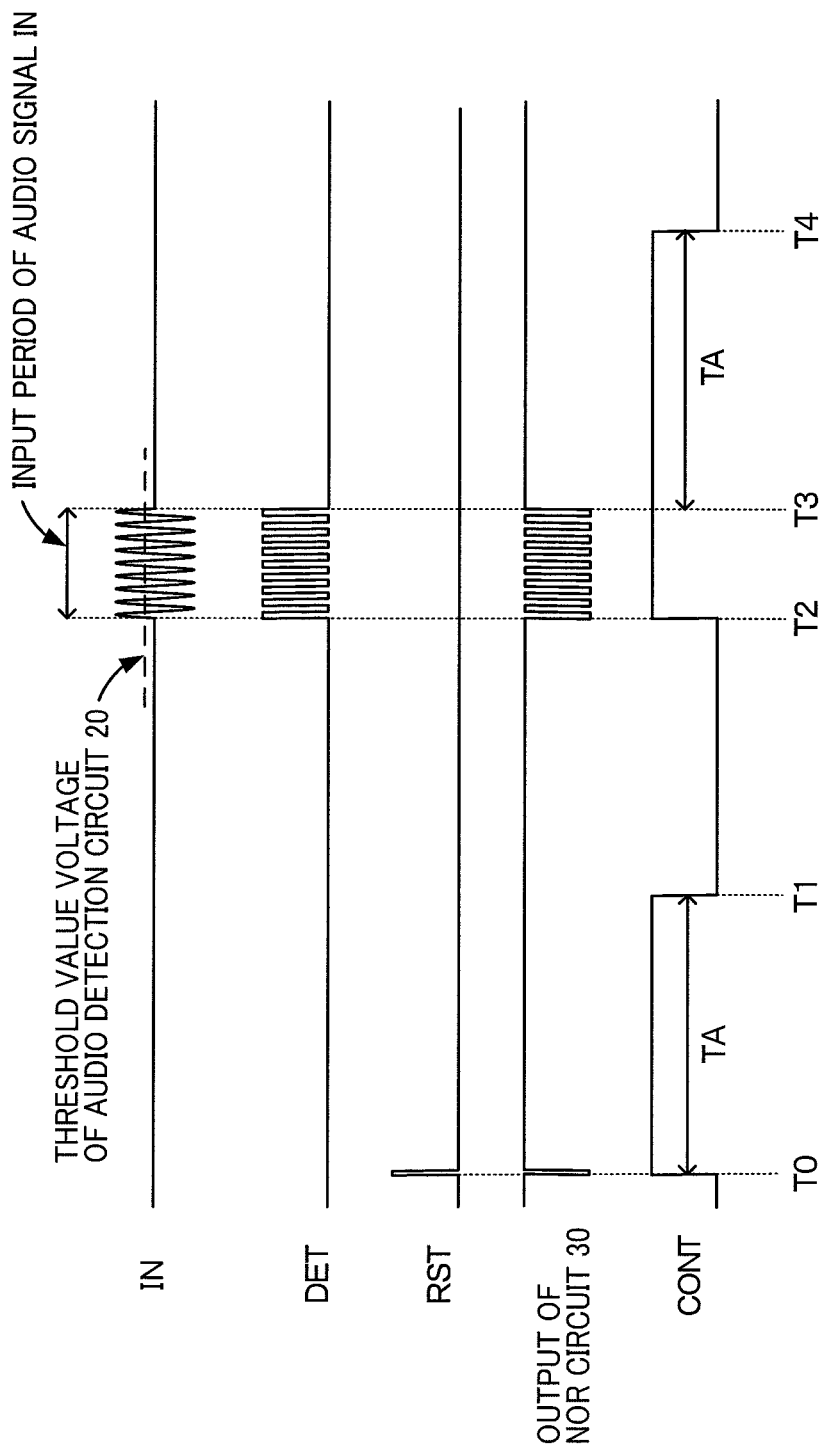
FIG. 3 is a timing chart for explaining an operation of an FM transmitter circuit 10 when a control circuit 21A is employed.

There will hereinafter be described an example of an operation of the FM transmitter circuit 10 when the control circuit 21A is employed, referring to a timing chart shown in FIG. 3. In an embodiment of the present invention, it is assumed that the power supply voltage is applied to the FM transmitter circuit 10 at a time T0. It is also assumed that frequency data of the carrier wave is set in the register 25 by the microcomputer (not shown), for example, during a period from the time T0 to a time T2 at which the audio signal IN is output from the music reproduction device 11.

When the power supply voltage is applied to the FM transmitter circuit 10 at the time T0, the reset circuit 32 outputs the reset signal RST having an H level pulse, so that the count value of the counter 33 is reset. Thus, the control signal CONT from the control signal output circuit 34 is changed to H level. When the control signal CONT becomes H level, the LDO regulator 22 is started. Since the LDO regulator 22 generates the power supply voltage VDD and the driving current IS, the FM modulation circuit 23 and the power amplifier 24 are also started. That is, the FM transmitter circuit 10 is started at the time T0. After the reset signal RST including having an H level pulse is output at the time T0, the output of the NOR circuit 30 becomes H level, and thus, the count value of the counter 33 is increased in synchronization with the clock signal CLK. When the count value of the counter 33 reaches 63 (decimal number) at the time T1, since the detection signal DET is L level, the control signal output circuit 34 outputs the control signal CONT at L level. As a result, the LDO regulator 22 stops generating the power supply voltage VDD and stops generating the driving current IS as well. Therefore, the FM modulation circuit 23 and the power amplifier 24 are stopped. That is, after the power supply voltage is applied to the FM transmitter circuit 10 at the time T0, if the presence of the audio signal IN is not detected during a period TA, which is a period until the count value of the counter 33 reaches 63 (decimal number), the control circuit 21A sets the control signal CONT to L so as to reduce power consumption of the FM transmitter circuit 10.

If a user operates the music reproduction device 11 at the time T2 so as to start reproducing music, the audio signal IN is input to the audio detection circuit 20. The audio detection circuit 20 outputs the H-level detection signal DET if the audio signal IN exceeds a predetermined threshold voltage. If the detection signal DET becomes H level, the counter 33 is reset, and thus, the control signal CONT becomes H level as in the case with the time T0. As a result, the LDO regulator 22 generates the power supply voltage VDD and the driving current IS, so that the FM modulation circuit 23 and the power amplifier 24 are started. In an embodiment of the present invention, the period TA is set such that a period during which the H-level detection signal DET is output in response to the input of the audio signal IN becomes sufficiently shorter than the above period TA. Therefore, during a period from the time T2 at which the audio signal IN is input to a time T3, the counter 33 continues to be reset, so that the count value does not reach 63 (decimal number.) That is, the FM transmitter circuit 10 is started when the music reproduction device 11 starts the reproduction of music, and the LDO regulator 22 keeps generating the power supply voltage VDD and the driving current IS while the music reproduction device 11 is reproducing music.

As described above, a frequency of the carrier wave in the FM modulation circuit 23 is set in the register 25. Therefore, the carrier wave is frequency-modulated according to the audio signal IN input during a period from the time T2 to the time T3, to be output to the power amplifier 24. The frequency-modulated carrier wave is amplified by the power amplifier 24, to be transmitted to the car stereo through the antenna 13.

When the music in the music reproduction device 11 is finished at the time T3 and the audio signal IN input to the audio detection circuit 20 is stopped, the audio detection circuit 20 outputs the L-level detection signal DET indicating the absence of the audio signal IN. As a result, the output from the NOR circuit 30 becomes H level, and the counter 33 increases the count value in synchronization with the clock signal CLK. At a time T4 at which the count value of the counter 33 reaches 63 (decimal number,) since the detection signal DET is L level, the control signal output circuit 34 changes the control signal CONT to L level. Based on the L-level control signal CONT, the LDO regulator 22 stops generating the power supply voltage VDD and the driving current IS. As a result, the frequency modulation circuit 23 and the power amplifier 24 are also stopped. That is, the FM transmitter circuit 10 is stopped. As described above, the FM transmitter circuit 10 according to an embodiment is started if the audio signal IN is input. If the audio signal IN is not input for the predetermined period TA during which the count value of the counter 33 is changed from zero to 63 (decimal number), the FM transmitter circuit 10 is stopped in order to reduce power consumption.

<Second embodiment of control circuit 21 and example of operation of FM transmitter circuit 10>

Figure 4:
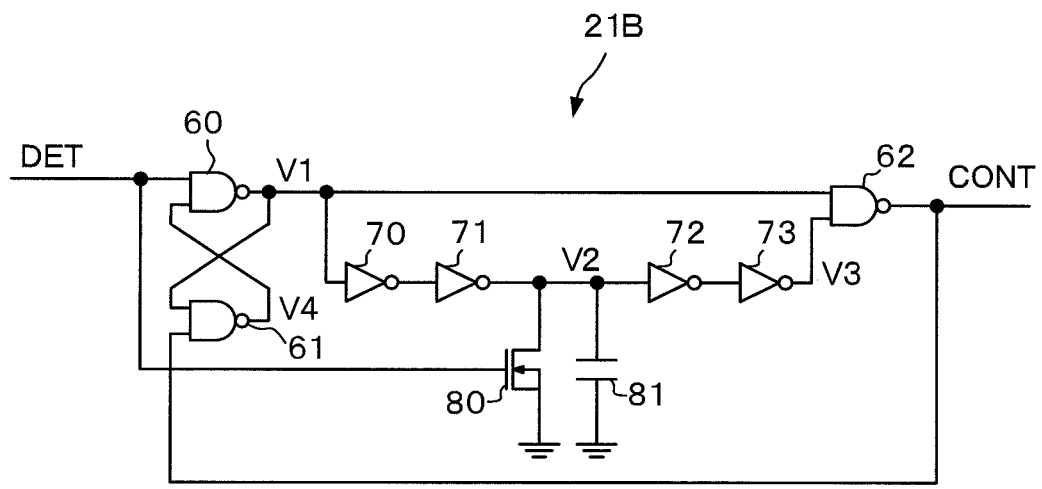
FIG. 4 is a diagram illustrating a configuration of a control circuit 21B according to a second embodiment of a control circuit 21.
Figure 5:
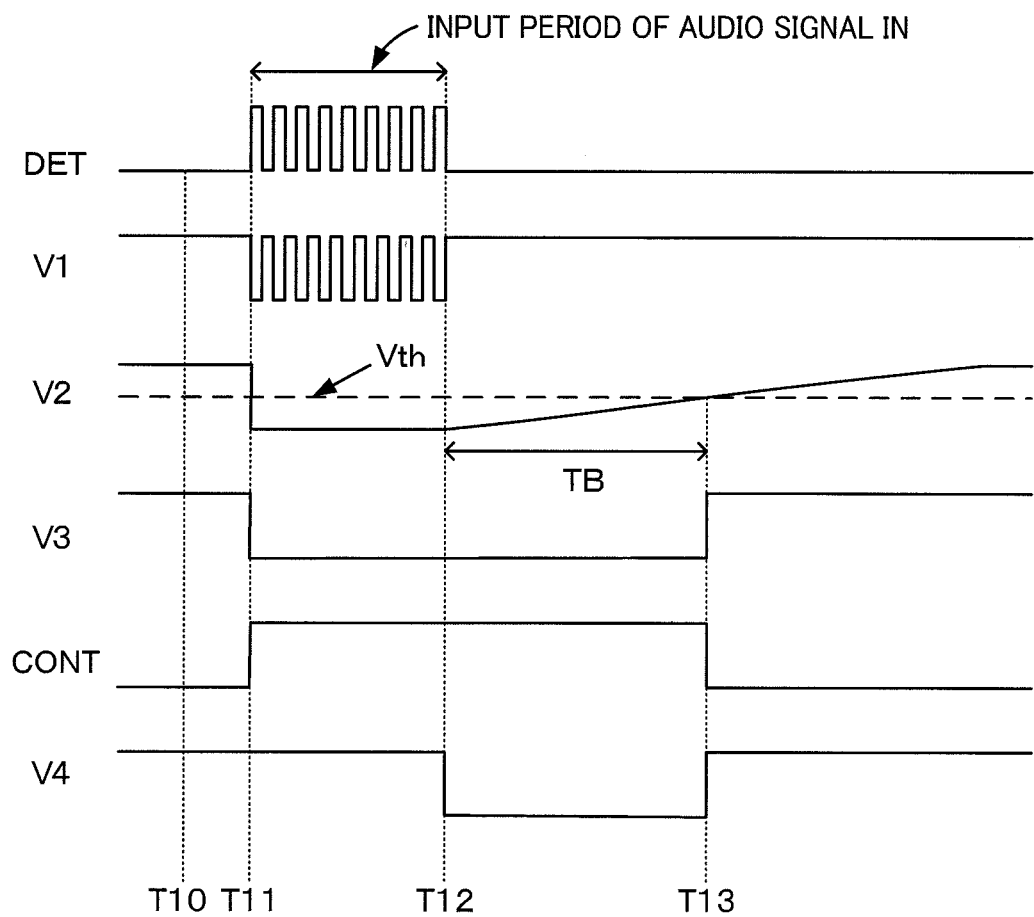
FIG. 5 is a timing chart for explaining an operation of an FM transmitter circuit 10 when the control circuit 21B is employed.
Figure 6:
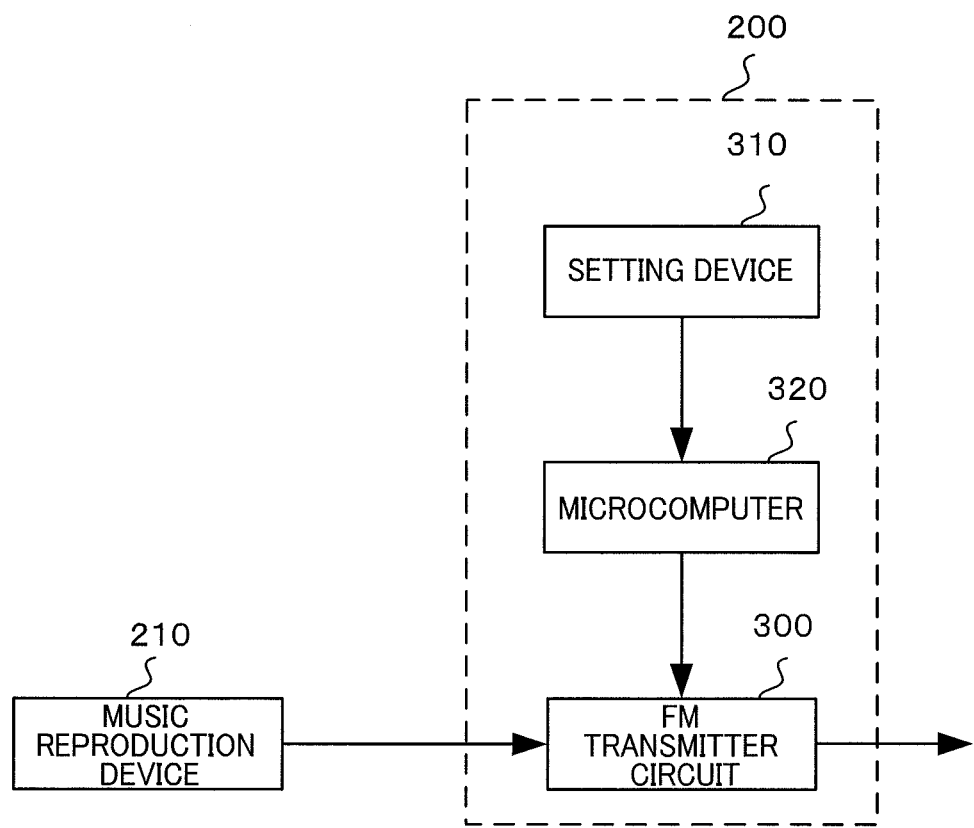
FIG. 6 is a diagram illustrating a configuration of a transmission device 200.

A second embodiment of the control circuit 21 will be described referring to FIG. 4. The control circuit 21 shown in FIG. 4 will hereinafter be referred to as a control circuit 21B. The control circuit 21B includes NAND circuits 60 to 62, inverters 70 to 73, an NMOS transistor 80, and a capacitor 81. The NAND circuits 60 and 61, the inverters 70 and 71, and the NMOS transistor 80 correspond to a charge and discharge circuit, and the inverters 72 and 73 and the NAND circuit 62 correspond to a control signal output circuit. Subsequently, details of the control circuit 21B and an example of an operation of the FM transmitter circuit 10 will be described referring to a timing chart shown in FIG. 5.

Here, a time T10 is a time at which sufficient time has elapsed since the power supply voltage is applied to the FM transmitter circuit 10. It is assumed that the user is supposed to start reproducing music by operating the music reproduction device 11 at a time T11. It is also assumed that frequency data of the carrier wave is stored in the register 25 during a period from a time when the power supply voltage is applied to the FM transmitter circuit 10 to the time T10.

At the time T10, since the audio signal IN from the music reproduction device 11 is not output, the detection signal DET at L level is output. Thus, the NMOS transistor 80 is turned off, and the NAND circuit 60 outputs an output voltage V1 at H level. Since a circuit including the inverters 70 and 71 outputs an output at the same logic level as that of the output voltage V1 of the NAND circuit 60, an output voltage V2 of the inverter 71 is H level. Moreover, a circuit including the inverters 72 and 73 also has the same configuration as that of the circuit including the inverters 70 and 71, an output voltage V3 of the inverter 73 is also H level. Therefore, the control signal CONT output from the NAND circuit 62 becomes L level. As a result, at the time T10 at which a sufficient time has elapsed since the power supply voltage is applied to the FM transmitter circuit 10, the LDO regulator 22 is in a stopped state. Since the control signal CONT is L level at the time T10, an output voltage V4 output from the NAND circuit 61 becomes H level.

Here, if the user operates the music reproduction device 11 at the time T11 so as to start reproducing music, the audio signal detection circuit 20 changes the detection signal DET to H level. If the detection signal DET becomes H level, the NAND circuit 60 changes the output voltage V1 to L level. According to the L-level output voltage V1 and the NMOS transistor 80 that is turned on in response to the H-level detection signal DET, the output voltage V2 of the inverter 71 becomes L level. Therefore, the output voltage V3 of the inverter 73 also becomes L level. When the output voltage V1 is changed from H level to L level, the NAND circuit 62 changes the control signal CONT to H level. Therefore, the LDO regulator 22 is started at the time T11, to generate the power supply voltage VDD and the driving current IS to the FM modulation circuit 23 and the power amplifier 24. That is, at the time T11, the FM transmitter circuit 10 is started. As described above, when the level of the audio signal IN is higher than the predetermined threshold voltage, the audio detection circuit 20 outputs the H-level detection signal DET, and when the level of the audio signal IN is lower than the predetermined threshold voltage, the circuit outputs the L-level detection signal DET. Therefore, during a period from the time T11, at which the audio signal IN is input, to the time T12, the logic level of the detection signal DET is changed in a cycle according to the audio signal IN. When the detection signal DET becomes H level, the voltage V1 becomes L level, and when the detection signal DET becomes L level, the voltage V1 becomes H level. Therefore, during the period from the time T11 to the time T12, the capacitor 81 repeats charging and discharging. In an embodiment of the present invention, a configuration is made such that a time constant for the inverter 71 to charge the capacitor 81 when the NMOS transistor 80 is turned off is sufficiently greater than a time constant to discharge the capacitor 81 when the NMOS transistor 80 is turned on. Therefore, during the period from the time T11 to the time T12, the capacitor 81 is in a discharged state, and the logic levels of the voltages V2 and V3, and the control signal CONT are L, L, H, respectively. As a result, during the period from the time T11 to the time T12, in the FM transmitter circuit 10, the carrier wave generated in the FM modulation circuit 23 is frequency-modulated by the audio signal IN output from the music reproduction device 11, to be transmitted to the car stereo (not shown.)

When the music in the music reproduction device 11 is finished at the time T12 and the audio signal IN input to the audio detection circuit 20 is stopped, the audio detection circuit 20 outputs the L-level detection signal DET indicating the absence of the audio signal IN. When the detection signal DET at L level is output, the output voltage v4 is at H level, and thus, the output voltage V1 of the NAND circuit 60 becomes H level. Moreover, in response to the L-level detection signal DET, the NMOS transistor 80 is turned off. As a result, the inverter 71 charges the capacitor 81 so as to raise the output voltage V2 from L level to H level. As described above, in an embodiment of the present invention, the configuration is made such that the time constant for the inverter 71 to charge the capacitor 81 when the NMOS transistor 80 is turned off is sufficiently greater than the time constant to discharge the capacitor 81 when the NMOS transistor 80 is turned on. Therefore, at a time T13, at which a period TB has elapsed from the time T12 when the inverter 71 starts charging the capacitor 81, a charging voltage of the capacitor 81 exceeds a threshold voltage Vth of the inverter 72. When the charging voltage of the capacitor 81 exceeds the threshold voltage Vth of the inverter 72 at the time T13, the output voltage V3 of the inverter 73 becomes H level. When both of the output voltages V1 and V3 become H level, the control signal CONT output from the NAND circuit 62 becomes L level. As a result, the LDO regulator 22 stops generating the power supply voltage VDD and the driving current IS for the FM modulation circuit 23 and the power amplifier 24, so that the FM transmitter circuit 10 is stopped. In this way, the FM transmitter circuit 10 according to an embodiment of the present invention is started when the audio signal IN is input. If the audio signal IN is not input for the predetermined period TB, which is until when the charging voltage of the capacitor 81 exceeds the threshold voltage Vth, the FM transmitter circuit 10 is stopped so as to reduce power consumption.

In the FM transmitter circuit 10 according to an embodiment of the present invention, which is configured as above, if the H-level detection signal DET when the presence of the audio signal IN is detected is input, the control circuit 21 starts the LDO regulator 22 so as to generate the driving current IS for driving the FM modulation circuit 23 and the power amplifier 24. That is, the FM transmitter circuit 10 is started when the audio signal IN is input. On the other hand, if the L-level detection signal DET when the absence of the audio signal IN is detected is input for the period TA or the period TB, which is a predetermined period, for example, the control circuit 21 stops the LDO regulator 22 so as to stop generating the driving current IS for driving the FM modulation circuit 23 and the power amplifier 24. Thus, the FM transmitter circuit 10 is stopped in order to reduce power consumption, if the audio signal IN is not input for the period TA or the period TB, which is a predetermined period. As described above, in an embodiment of the present invention, it is possible to start or stop the FM transmitter circuit 10 without inputting a control signal for starting or stopping. Therefore, it becomes possible to reduce a load of a microcomputer or the like, as compared to a case of controlling start and stop of the FM transmitter circuit 10 using the microcomputer or the like, for example.

The control circuit 21A according to an embodiment of the present invention includes the counter 33 for resetting the count value in response to the H-level detection signal DET when the presence of the audio signal IN is detected, and for changing the count value in response to the L-level detection signal DET when the absence of the audio signal IN is detected. When the count value of the counter 33 reaches 63 (decimal number) corresponding to the predetermined period TA, the control signal output circuit 24 changes the control signal CONT to L level so as to stop the LDO regulator 22. By using the control circuit 21A, when the presence of the audio signal IN is detected, the FM transmitter circuit 10 is started, and when the absence of the audio signal IN for the predetermined period TA is detected, the FM transmitter circuit 10 is stopped. Therefore, by using the control circuit 21A, the FM transmitter circuit 10 can be started or stopped without the control signal for starting or stopping being input.

In the control circuit 21B according to an embodiment, the NMOS transistor 80 is turned on in response to the H-level detection signal DET when the presence of the audio signal IN is detected, so that the capacitor 81 is discharged. The NMOS transistor 80 is turned off in response to the L-level detecting signal DET when the absence of the audio signal IN is detected, so that the capacitor 81 is charged. In an embodiment of the present invention, when the charging voltage of the capacitor 81 reaches the threshold voltage Vth corresponding to the predetermined period TB, the NAND circuit 62 changes the control signal CONT to L level so as to stop the LDO regulator 22. As above, in the control circuit 21B according to an embodiment of the present invention, when the charging voltage of the capacitor 81 is lower than the threshold voltage Vth, the FM transmitter circuit 10 is started, and when the charging voltage of the capacitor 81 is higher than the threshold voltage Vth, the FM transmitter circuit 10 is stopped. Therefore, by using the control circuit 21B, the FM transmitter circuit 10 can be started or stopped without the control signal for starting or stopping being input.

The above embodiments of the present invention are simply for facilitating the understanding of the present invention and are not in any way to be construed as limiting the present invention. The present invention may variously be changed or altered without departing from its spirit and encompass equivalents thereof.

The FM transmitter circuit 10 according to an embodiment of the present invention is assumed to include the power amplifier 24, however, the power amplifier 24 may be provided outside the integrated FM transmitter circuit 10, for example.

What is claimed is:

1. An audio signal processing circuit comprising:
a modulation circuit configured to output a modulated signal of a frequency corresponding to an input audio signal;
a drive circuit configured to generate a driving current for driving the modulation circuit based on a control signal;
an audio detection circuit configured to detect presence or absence of the audio signal input to the modulation circuit; and
a control signal generation circuit configured to
generate the control signal for generating the driving current in the drive circuit when the presence of the audio signal is detected and
generate the control signal for stopping generation of the driving current in the drive circuit when the absence of the audio signal is detected for a predetermined period, based on a detection result of the audio detection circuit, wherein
the drive circuit is configured to generate the driving current based on the control signal of one logic level, and stop the generation of the driving current based on the control signal of the other logic level; and wherein
the audio detection circuit is configured to output a detection signal of one logic level when the presence of the audio signal is detected, and output the detection signal of the other logic level when the absence of the audio signal is detected; and wherein
the control signal generation circuit includes:
a counter configured to reset a count value when the detection signal becomes the one logic level, and start counting in synchronization with a clock signal of a predetermined cycle when the detection signal becomes the other logic level; and
a control signal output circuit configured to output the control signal of the other logic level when the count value reaches a predetermined value corresponding to the predetermined period, and output the control signal of the one logic level when the count value does not reach the predetermined value.

2. An audio signal processing circuit comprising:
a modulation circuit configured to output a modulated signal of a frequency corresponding to an input audio signal;
a drive circuit configured to generate a driving current for driving the modulation circuit based on a control signal;
an audio detection circuit configured to detect presence or absence of the audio signal input to the modulation circuit; and
a control signal generation circuit configured to
generate the control signal for generating the driving current in the drive circuit when the presence of the audio signal is detected and
generate the control signal for stopping generation of the driving current in the drive circuit when the absence of the audio signal is detected for a predetermined period, based on a detection result of the audio detection circuit, wherein
the drive circuit is configured to generate the driving current based on the control signal of one logic level, and stop the generation of the driving current based on the control signal of the other logic level; and wherein
the audio detection circuit is configured to output a detection signal of one logic level when the presence of the audio signal is detected, and output the detection signal of the other logic level when the absence of the audio signal is detected; and wherein
the control signal generation circuit includes:
a charge and discharge circuit configured to discharge a capacitor when the detection signal becomes the one logic level, and charge the capacitor when the detection signal becomes the other logic level; and
a control signal output circuit configured to output the control signal of the one logic level when a charging voltage of the capacitor is lower than a predetermined voltage corresponding to the predetermined period, and output the control signal of the other logic level when the charging voltage is higher than the predetermined voltage.

* * * * *